US012248019B2

(12) United States Patent
Yeh et al.

(10) Patent No.: US 12,248,019 B2
(45) Date of Patent: Mar. 11, 2025

(54) DIODE TEST MODULE FOR MONITORING LEAKAGE CURRENT AND ITS METHOD THEREOF

(71) Applicant: AMAZING MICROELECTRONIC CORP., New Taipei (TW)

(72) Inventors: Chih-Ting Yeh, Hsinchu County (TW); Sung Chih Huang, Yilan County (TW); Kun-Hsien Lin, Hsinchu (TW); Che-Hao Chuang, Hsinchu County (TW)

(73) Assignee: AMAZING MICROELECTRONIC CORP., New Taipei (TW)

( * ) Notice: Subject to any disclaimer, the term of this patent is extended or adjusted under 35 U.S.C. 154(b) by 617 days.

(21) Appl. No.: 17/536,513

(22) Filed: Nov. 29, 2021

(65) Prior Publication Data

US 2023/0168298 A1  Jun. 1, 2023

(51) Int. Cl.
*H01L 27/02* (2006.01)
*G01R 31/26* (2020.01)
*G01R 31/30* (2006.01)

(52) U.S. Cl.
CPC ..... *G01R 31/3008* (2013.01); *G01R 31/2632* (2013.01); *H01L 27/0255* (2013.01)

(58) Field of Classification Search
CPC .................................................. H01L 27/0255
See application file for complete search history.

(56) References Cited

U.S. PATENT DOCUMENTS

| 5,239,270 | A | * | 8/1993 | Desbiens | ........... G01R 31/2648 324/719 |
| 7,298,159 | B1 | * | 11/2007 | Rozario | ............. G01R 31/2623 324/762.01 |
| 8,169,000 | B2 | | 5/2012 | Chuang et al. | |
| 10,903,204 | B2 | | 1/2021 | Chuang et al. | |
| 11,056,481 | B2 | | 7/2021 | Yeh et al. | |
| 11,448,690 | B2 | * | 9/2022 | Segarra | ................ G01R 31/275 |
| 2007/0121390 | A1 | * | 5/2007 | Houston | ................ G11C 29/50 365/189.09 |
| 2016/0276332 | A1 | * | 9/2016 | Laine | ................... H01L 27/0251 |

\* cited by examiner

*Primary Examiner* — Douglas King
(74) *Attorney, Agent, or Firm* — Rosenberg, Klein & Lee

(57) ABSTRACT

A diode test module and method applicable to the diode test module are provided. A substrate having first conductivity type and an epitaxial layer having second conductivity type on the substrate are formed. A well region having first conductivity type is formed in the epitaxial layer. A first and second heavily doped region having second conductivity type are theoretically formed in the well and connected to a first and second I/O terminal, respectively. Isolation trench is formed there in between for electrical isolation. A monitor cell comprising a third and fourth heavily doped region is provided in a current conduction path between the first and second I/O terminal when inputting an operation voltage. By employing the monitor cell, the invention achieves to determine if the well region is missing by measuring whether a leakage current is generated without additional testing equipment and time for conventional capacitance measurements.

15 Claims, 16 Drawing Sheets

DIODE TEST MODULE FOR MONITORING LEAKAGE CURRENT AND ITS METHOD THEREOF

BACKGROUND OF THE INVENTION

Field of the Invention

The present invention is related to a diode test module. And more particularly, it is related to a diode test module in which a monitor cell is employed for detecting if a leakage current is generated, so as to determine whether or not a well region in the steering diodes configuration is missing. A test method applicable to the diode test module is accompanying described and claimed as well.

Description of the Prior Art

In general, steering diodes are known as low capacitance devices that provide high-speed data line and I/O port protection from transients caused by Electrostatic Discharge (ESD), Electrical Fast Transients (EFT) and other induced voltages. These devices are aimed to divert the transient to the power-bus or ground and away from sensitive IC components to protect the IC components. As a result, it has been verified that a common means of protecting high-speed data lines is to employ steering diodes in a rail-to-rail configuration. Two devices per line are connected between two fixed reference voltages, such as a power terminal (VDD) and a ground terminal (GND). When the transient voltage on the data line exceeds the forward voltage drop of the diode plus the reference voltage, the steering diodes direct the surge to the supply rail or to the ground.

The advantages of such steering diodes configuration include low loading capacitance, fast response times and inherent bidirectionally (within the reference voltages). FIG. 1 shows a typical low capacitance steering diodes configuration in the prior art, in which the rail-to-rail configuration includes a first N-type diode 11 and a second N-type diode 21. The first N-type diode 11 is formed by employing a semiconductor device, comprising a P-type substrate (P-sub) 101, an N-type epitaxial layer (N-epi) 103 disposed on the P-type substrate 101, a P-type well region (P-well) 105A in the N-type epitaxial layer 103 and an N-type heavily doped region (N+) 107A in the P-type well region 105A for being electrically connected to a first I/O pin I/O1.

Similarly, the second N-type diode 21 is formed by employing a semiconductor device, comprising the P-type substrate (P-sub) 101, the N-type epitaxial layer (N-epi) 103 disposed on the P-type substrate 101, a P-type well region (P-well) 105B in the N-type epitaxial layer 103 and an N-type heavily doped region (N+) 107B in the P-type well region 105B for being electrically connected to a second I/O pin I/O2. A plurality of trenches 161 are disposed therein between the semiconductor device for isolating the first N-type diode 11 and the second N-type diode 21.

However, when considering the fabricating process of such semiconductor device, it draws our attention that the P-type well region may not be properly formed, due to certain particle or lithography issue occurring in the fabricating process. FIG. 2 shows a schematical diagram illustrating that the P-type well region of the foregoing first N-type diode 11 is not formed. As we know, such a failed structure is not possibly be detected by simple DC measurements. Additional testing equipment and testing process must be carried out to find the failed structure since its capacitance, when viewing from the first I/O pin I/O1 will be greatly increased due to a reduced number of junctions. Therefore, an abundant variety of additional testing time and cost, measuring capacitances of the device, are believed as consuming and need to be avoided.

As a result, it, in view of all, should be apparent and obvious that there is indeed an urgent need for the professionals in the field for a novel and inventive diode test module and its test method to be developed, so as to solve the above-mentioned issues occurring in the prior art, and to find the failed structure in a much more efficient methodology without paying extra time as well as cost for performing the test criteria.

SUMMARY OF THE INVENTION

In order to overcome the above-mentioned disadvantages, one major objective in accordance with the present invention is provided for a novel and creative diode test module for monitoring leakage current. The proposed diode test module is characterized by adopting a monitor cell which is configured to be disposed in a current conduction path between a first I/O terminal and a second I/O terminal when either the first I/O terminal or the second I/O terminal is biased. The monitor cell comprises a third heavily doped region and a fourth heavily doped region, and at least one isolation trench is configured between the third heavily doped region and the fourth heavily doped region for electrical isolation. By employing the proposed monitor cell structure, it is operable to detect whether a leakage current is generated, so as to ensure if a missing well region exists in the steering diodes configuration.

Another objective in accordance with the present invention is provided for a novel method applicable to a diode test module for monitoring leakage current. As for performing the proposed method, it is effective and relatively simple to examine whether or not a well region of the steering diodes configuration is not formed and thus become missing. A failed steering diodes structure can be easily found out by performing simple DC measurements, without involving in additional capacitance measurement. As a result, it is believed that the complexity of such a testing method, compared to the prior arts is thus, greatly much reduced. And in addition, the testing time and production cost can be significantly lowered owing to the proposed method of the present invention.

In addition, in the following descriptions, the Applicants further provide a plurality of embodiments and variations that will be discussed later in the following paragraphs in order to verify the diode test module and its test method thereof are effective. Thereby, it is worthy of full attentions that the present invention achieves to successfully solve the problems of prior arts and meanwhile maintain superior electrical properties. As a result, it is believed that the proposed diode test module of the present invention and its test method thereof are extremely advantageous of as being highly competitive and able to be widely utilized in related IC and semiconductor industries.

Therefore, in order to achieve the above mentioned objectives, the present invention is aimed to provide a diode test module for monitoring leakage current. The proposed diode test module comprises a substrate having a first conductivity type, an epitaxial layer having a second conductivity type on the substrate, a well region having the first conductivity type in the epitaxial layer, a first heavily doped region having the second conductivity type and a second heavily doped region having the second conductivity type in the well region, wherein the first heavily doped region and the second heavily doped region are electrically connected with a first I/O terminal and a second I/O terminal, respectively; at least one isolation trench between the first heavily doped region and the second heavily doped region for electrical isolation, wherein the at least one isolation trench has a depth greater than that of the epitaxial layer, and a monitor cell which is configured in a current conduction path between the first I/O terminal and the second I/O terminal when either the first I/O terminal or the second I/O terminal is biased.

According to the present invention, the proposed monitor cell comprises a third heavily doped region having the second conductivity type and a fourth heavily doped region having the second conductivity type. The at least one isolation trench is configured between the third heavily doped region and the fourth heavily doped region for electrical isolation, and the third heavily doped region and the fourth heavily doped region are metal wired. As a result, the proposed monitor cell is employed to detect whether a leakage current is generated when an operation voltage is input through the first I/O terminal or the second I/O terminal, to ensure if the first heavily doped region or the second heavily doped region is truly fabricated in the well region.

According to one embodiment of the present invention, the third heavily doped region and the fourth heavily doped region are formed in the epitaxial layer, and a contact metal line is connecting between the third heavily doped region and the fourth heavily doped region of the monitor cell, such that the third heavily doped region and the fourth heavily doped region form a short circuit.

Moreover, a fifth heavily doped region having the first conductivity type can be further disposed, and the fifth heavily doped region having the first conductivity type is configured adjacent to the first heavily doped region. Similarly, a sixth heavily doped region having the first conductivity type can also be further disposed, and the sixth heavily doped region having the first conductivity type is configured adjacent to the second heavily doped region.

According to one embodiment of the present invention, the said fifth heavily doped region and the said sixth heavily doped region can be selectively formed in the epitaxial layer. Alternatively, according to another embodiment of the present invention, the said fifth heavily doped region and the said sixth heavily doped region may also be selectively formed in the well region. The present invention provides various implementations for disposing the fifth heavily doped region and the sixth heavily doped region, and yet, the present invention is not limited thereto by these configurations.

Generally, in one embodiment, when the first conductivity type is P-type, the second conductivity type is N-type, and the fifth heavily doped region and the sixth heavily doped region having the first conductivity type are electrically connected to a ground bus line.

Alternatively, in another embodiment, when the first conductivity type is N-type, the second conductivity type is P-type, and the fifth heavily doped region and the sixth heavily doped region having the first conductivity type are electrically connected to a high voltage level bus line.

In addition, according to yet another variation of the present invention, the diode test module may further comprise a second well region for accommodating the third heavily doped region and the fourth heavily doped region of the monitor cell. The proposed second well region is configured as having the first conductivity type and the second well region is disposed in the epitaxial layer, such that the third heavily doped region and the fourth heavily doped region are formed in the second well region.

In such a variation embodiment when the third heavily doped region and the fourth heavily doped region are formed in the second well region, a fifth heavily doped region adjacent to the first heavily doped region, and a sixth heavily doped region adjacent to the second heavily doped region can also be further disposed.

According to the embodiment of the present invention, the fifth heavily doped region and the sixth heavily doped region are having the first conductivity type.

In one embodiment, the fifth heavily doped region having the first conductivity type and the sixth heavily doped region having the first conductivity type can be formed in the epitaxial layer. Alternatively, the fifth heavily doped region having the first conductivity type and the sixth heavily doped region having the first conductivity type may also be formed in the well region.

Similarly, when the first conductivity type is P-type, the second conductivity type is N-type, and the fifth heavily doped region and the sixth heavily doped region having the first conductivity type are electrically connected to a ground bus line. On the contrary, when the first conductivity type is N-type, the second conductivity type is P-type, and the fifth heavily doped region and the sixth heavily doped region having the first conductivity type will be electrically connected to a high voltage level bus line, instead.

In general, those skilled in the art and having general knowledge are able to make appropriate modifications or variations with respective to the technical contents disclosed in the present invention without departing from the spirits of the present invention. The present invention is certainly not restricted by the certain limited configurations and/or conductivity types disclosed in the embodiments of the present invention. As such, it is believed that the modifications or variations should still fall into the scope of the present invention, and the present invention covers the modifications and variations.

In another aspect, the present invention is also aimed to provide a method applicable to a diode test module for monitoring leakage current, which comprises the following steps:

(a) providing a substrate having a first conductivity type, and an epitaxial layer having a second conductivity type on the substrate.

(b) forming a well region having the first conductivity type in the epitaxial layer, and a first heavily doped region having the second conductivity type and a second heavily doped region having the second conductivity type in the well region, wherein the first heavily doped region and the second heavily doped region are electrically connected with a first I/O terminal and a second I/O terminal, respectively.

(c) forming at least one isolation trench between the first heavily doped region and the second heavily doped region for electrical isolation, wherein the at least one isolation trench has a depth greater than that of the epitaxial layer.

(d) providing a monitor cell which is configured in a current conduction path between the first I/O terminal and the second I/O terminal when either the first I/O terminal or the second I/O terminal is biased.

The monitor cell comprises a third heavily doped region having the second conductivity type and a fourth heavily doped region having the second conductivity type, the at least one isolation trench is configured between the third heavily doped region and the fourth heavily doped region for electrical isolation, and the third heavily doped region and the fourth heavily doped region are metal wired.

(e) As a result, when an operation voltage is input through the first I/O terminal or the second I/O terminal, it is determined if the first heavily doped region or the second heavily doped region is truly fabricated in the well region by measuring whether a leakage current is generated through the monitor cell.

As a result, based on the diode test module and the test method thereof, it is evident that the present invention is sophisticatedly designed and indeed discloses a novel modified scheme for monitoring the leakage current. From the monitoring result, the present invention achieves in effectively find out if a well region of the steering diodes configuration is not successfully fabricated and is missing. The proposed diode test module is inventive, and its method thereof is highly efficient since merely DC leakage current measurements are needed. There is no extra testing equipment, testing cost and man-hour required as in the conventional prior arts.

As a result, the proposed diode test module and test method thereof disclosed by the present invention, are beneficial in view of a great number of merits. Thus, it is believed that the present invention is extremely advantageous while compared to the prior arts.

These and other objectives of the present invention will become obvious to those of ordinary skill in the art after reading the following detailed description of preferred embodiments.

It is to be understood that both the foregoing general description and the following detailed description are exemplary and are intended to provide further explanation of the invention as claimed.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
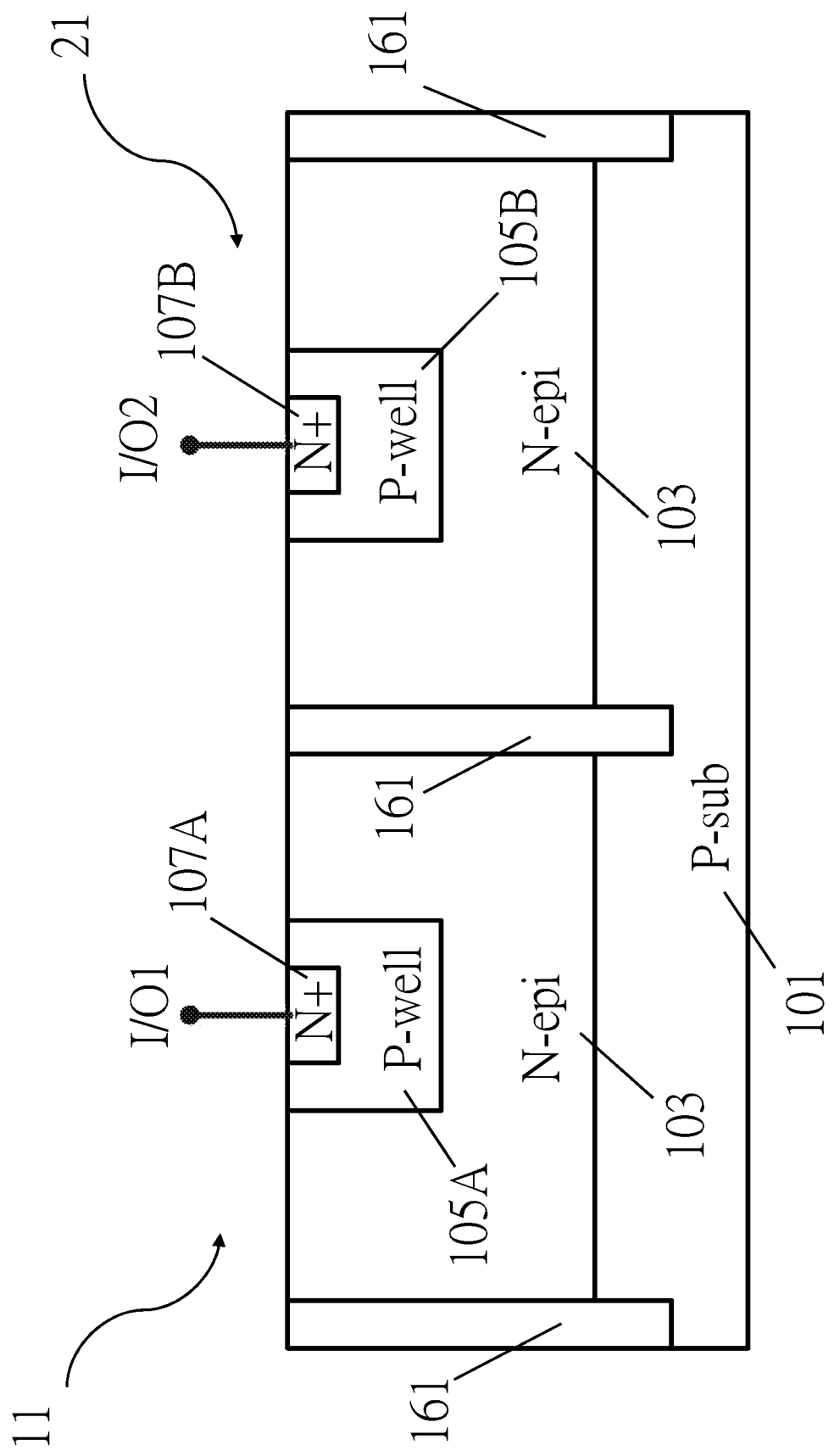
FIG. 1 shows a typical low capacitance steering diodes configuration in the prior art.
Figure 2:
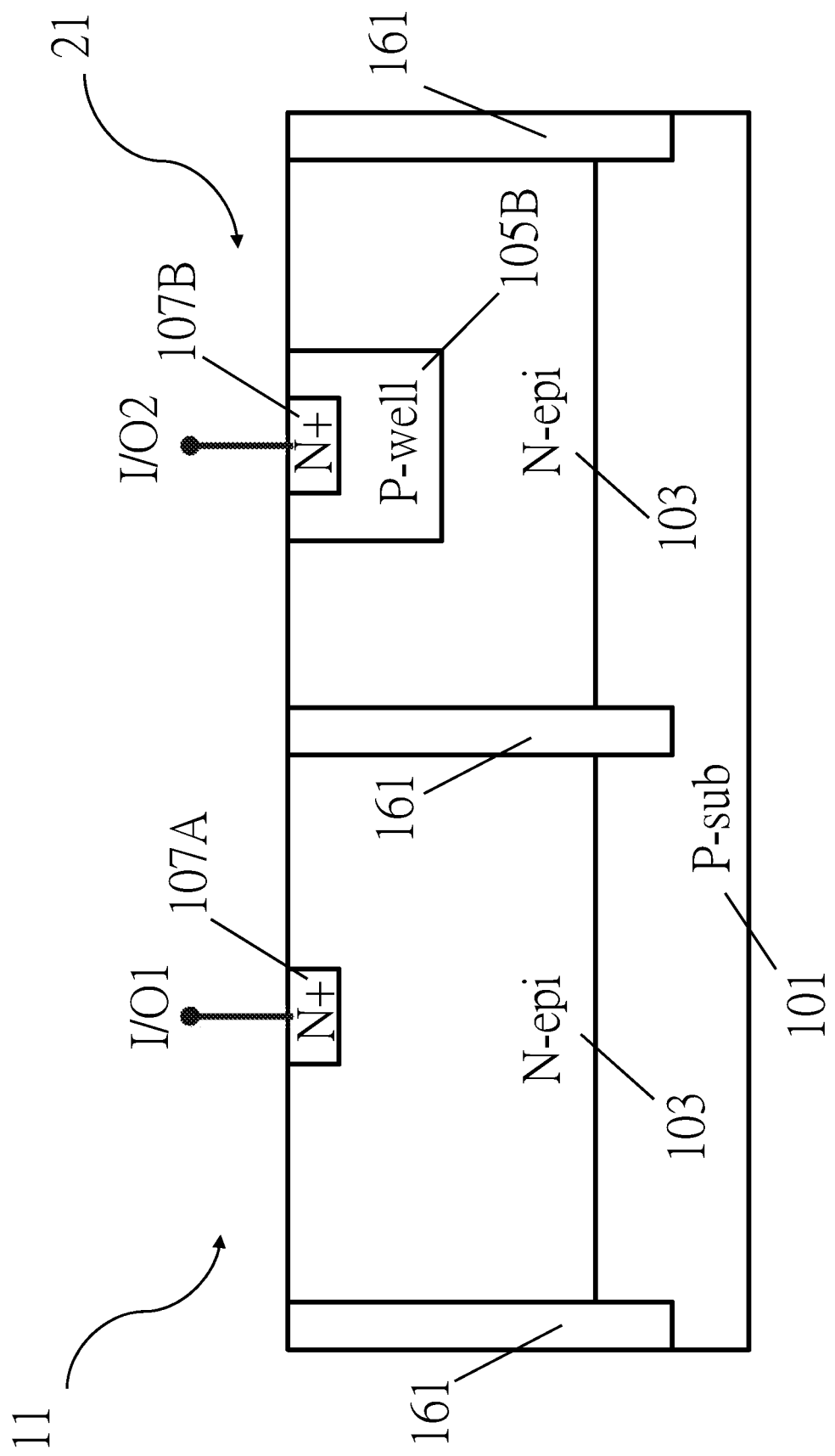
FIG. 2 shows a schematical diagram illustrating that the P-type well region of the first N-type diode according to FIG. 1 is not formed.

Reference will now be made in detail to the preferred embodiments of the present invention, examples of which are illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

The embodiments described below are illustrated to demonstrate the technical contents and characteristics of the present invention and to enable the persons skilled in the art to understand, make, and use the present invention. However, it shall be noticed that, it is not intended to limit the scope of the present invention. Therefore, any equivalent modification or variation according to the spirit of the present invention is to be also included within the scope of the present invention.

Unless otherwise specified, some conditional sentences or words, such as "can", "could", "might", or "may", usually attempt to express that the embodiment in the invention has, but it can also be interpreted as a feature, element, or step that may not be needed. In other embodiments, these features, elements, or steps may not be required.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The phrases "be coupled to," "couples to," and "coupling to" are intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The invention is particularly described with the following examples which are only for instance. Those skilled in the art will readily observe that numerous modifications and alterations of the device and method may be made while retaining the teachings of the invention. Accordingly, the following disclosure should be construed as limited only by the metes and bounds of the appended claims. In the whole patent application and the claims, except for clearly described content, the meaning of the article "a" and "the" includes the meaning of "one or at least one" of the element or component. Moreover, in the whole patent application and the claims, except that the plurality can be excluded obviously according to the context, the singular articles also contain the description for the plurality of elements or components. In the entire specification and claims, unless the contents clearly specify the meaning of some terms, the meaning of the article "wherein" includes the meaning of the articles "wherein" and "whereon". The meanings of every term used in the present claims and specification refer to a usual meaning known to one skilled in the art unless the meaning is additionally annotated. Some terms used to describe the invention will be discussed to guide practitioners about the invention. Every example in the present specification cannot limit the claimed scope of the invention.

The terms "substantially," "around," "about" and "approximately" can refer to within 20% of a given value or range, and preferably within 10%. Besides, the quantities provided herein can be approximate ones and can be described with the aforementioned terms if are without being specified. When a quantity, density, or other parameters includes a specified range, preferable range or listed ideal values, their values can be viewed as any number within the given range.

Figure 3:
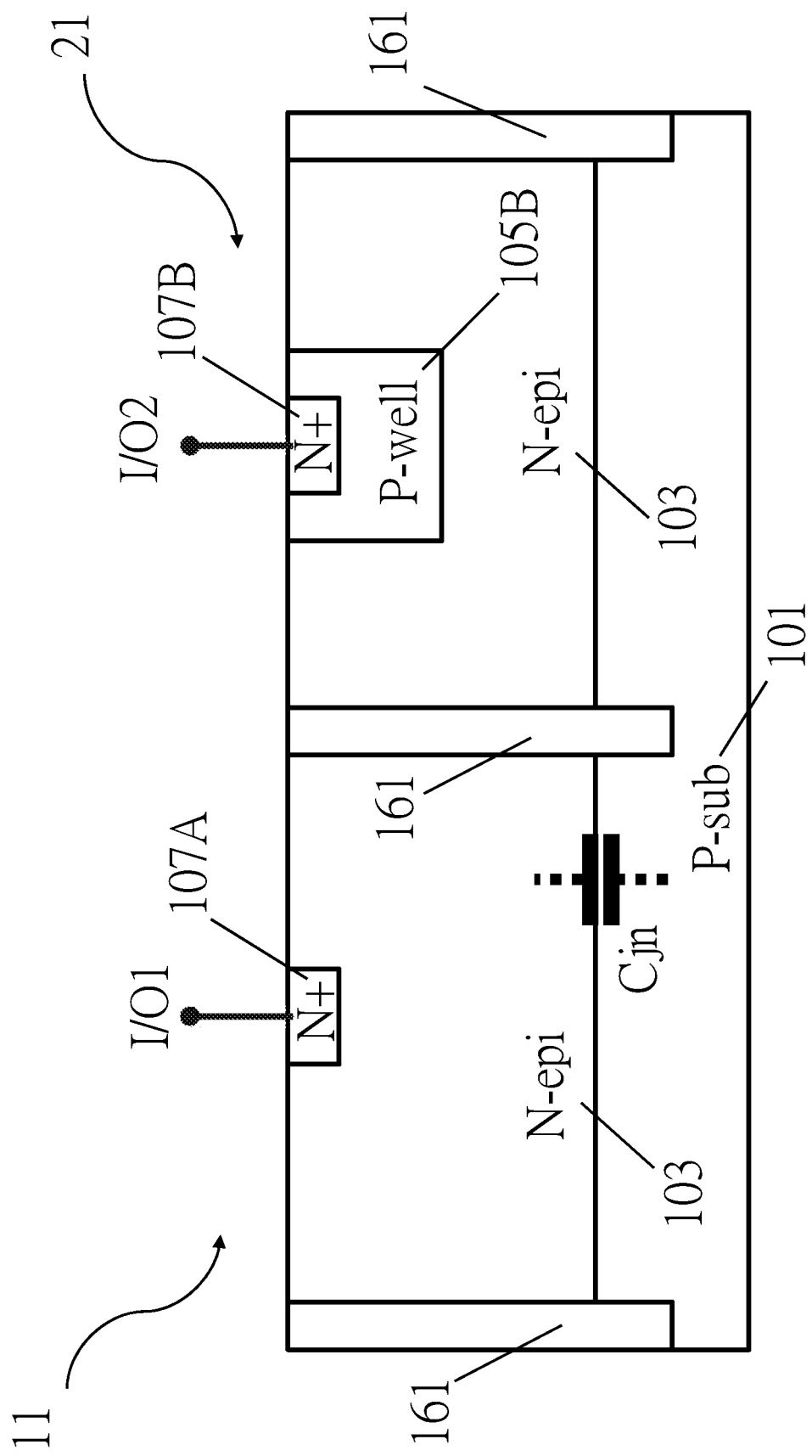
FIG. 3 shows a schematical diagram illustrating that an increased capacitance will be formed between the junction of the substrate and the epitaxial layer since the P-type well region of the N-type diode is missing in the prior art.

As the Applicants have described earlier in the Description of the Prior Art, due to certain particle or lithography issue occurring in the fabricating process of the conventional steering diodes configuration, a well region of the diode may not be properly formed and become missing. Please refer FIG. 3 for a schematical diagram showing that the increased capacitance Cjn will be formed between the junction of the P-type substrate 101 and the N-type epitaxial layer 103 since the well region of the first N-type diode 11 is missing. It is known that such failed structure can not be detected by DC measurements and can only be found by employing additional test equipment and test time for performing capacitance measurements. In order to solve the deficiency, the present invention is aimed to provide a much more efficient diode test module and its test method thereof for reducing the conventional test production cost and test time.

Figure 4:
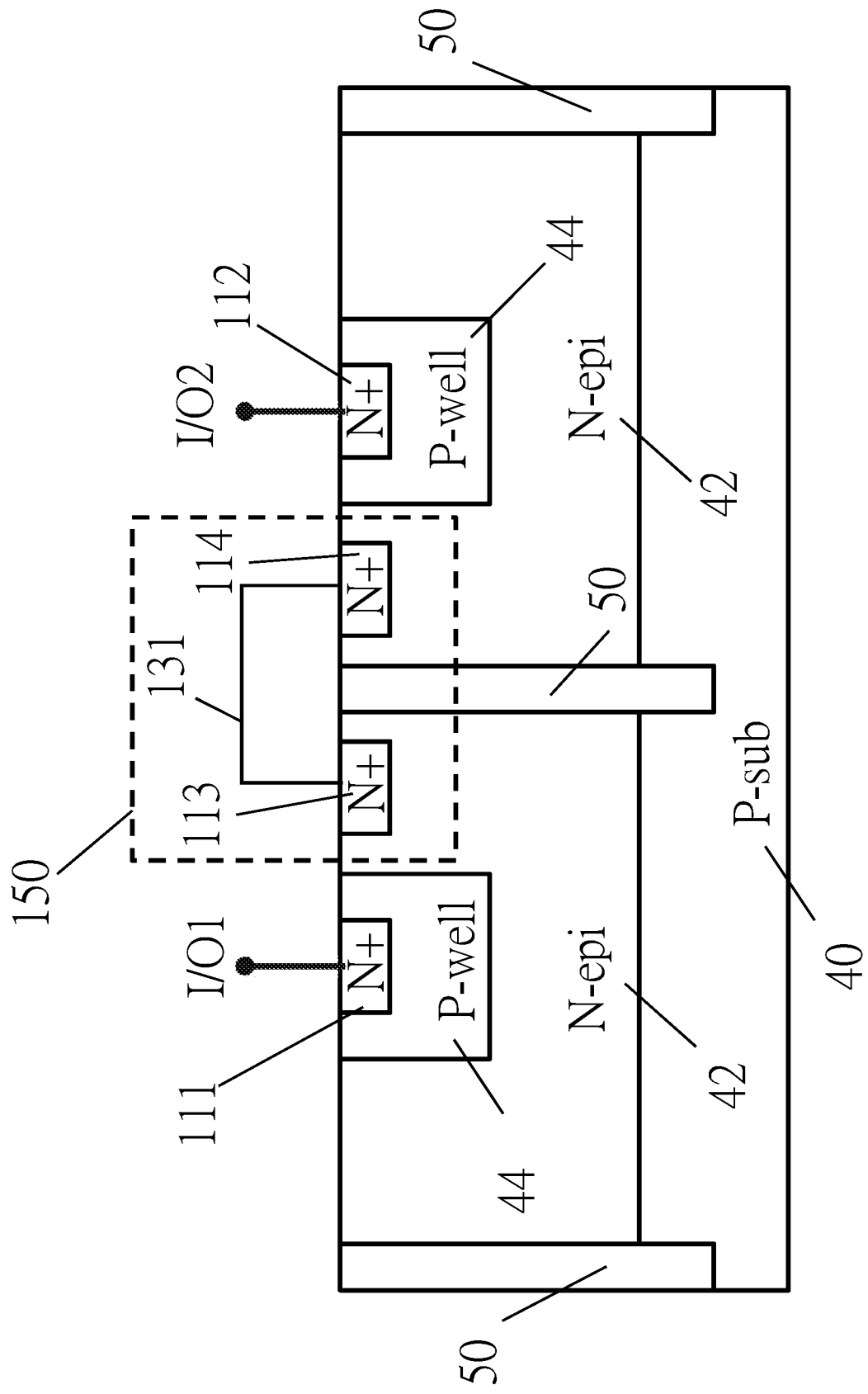
FIG. 4 schematically shows a structural diagram of a diode test module in accordance with one embodiment of the present invention.

Please refer to FIG. 4 first, which schematically shows a structural diagram of a diode test module in accordance with one embodiment of the present invention. A substrate having a first conductivity type is provided in such embodiment of FIG. 4, as a P-type substrate (P-sub) 40, and an epitaxial layer having a second conductivity type is formed on the P-type substrate 40, illustrated as an N-type epitaxial layer (N-epi) 42. In such an embodiment, the first conductivity type is illustrative as P type, and the second conductivity type is illustrative as N type. In alternative embodiments of the present invention, the first conductivity type can be illustrative as N type, and the second conductivity type can be illustrative as P type as well. The present invention is not limited thereto, and the alternative variations and embodiments will be provided and discussed later in the present invention.

A well region having the first conductivity type in the N-type epitaxial layer (N-epi) 42 is provided as a P-type well (P-well) 44, and a first heavily doped region having the second conductivity type, which is the first heavily doped region N+ 111, and a second heavily doped region having the second conductivity type, which is the second heavily doped region N+ 112, are theoretically being formed in the P-type well (P-well) 44. The first heavily doped region N+ 111 and the second heavily doped region N+ 112 are electrically connected with a first I/O terminal I/O1 and a second I/O terminal I/O2, respectively.

At least one isolation trench 50 is formed between the first heavily doped region N+ 111 and the second heavily doped region N+ 112 for electrical isolation. According to the embodiment of the present invention, the at least one isolation trench 50 has a depth greater than a depth of the N-type epitaxial layer 42.

However, as we have discussed earlier that a missing well region could be possibly generated due to certain process deficiencies and can only be examined by extra testing equipment and testing time, the present invention is thus proposing to adopt an inventive and novel monitor cell 150, which is configured in a current conduction path between the first I/O terminal I/O1 and the second I/O terminal I/O2 when either the first I/O terminal I/O1 or the second I/O terminal I/O2 is biased so as to measure a leakage current and to ensure if the well region is truly fabricated. Please refer to FIG. 5, which schematically shows a structural diagram of the diode test module in accordance with the embodiment in FIG. 4 when the P-type well 44 on the side of the first I/O terminal I/O1 is not formed. As can be seen, when the P-type well (P-well) 44 on the side of the first I/O terminal I/O1 is not properly formed and become missing, such that the first heavily doped region N+ 111 is not actually disposed in the P-type well (P-well) 44, but directly disposed in the N-type epitaxial layer (N-epi) 42, under such a situation, there will only be two junctions of the second heavily doped region N+ 112/the P-type well (P-well) 44 and the P-type well (P-well) 44/the N-type epitaxial layer (N-epi) 42 formed on the side of the second I/O terminal I/O2. As a result, when an operation voltage is input through the second I/O terminal I/O2, then a leakage path, as indicated by the arrows shown in FIG. 5, will be generated from the second I/O terminal I/O2 to the first I/O terminal I/O1. Therefore, based on such electrical mechanism, the present invention proposes to provide the disclosed monitor cell 150, which is to be configured in the current conduction path between the second I/O terminal I/O2 and the first I/O terminal I/O1 when the operation voltage is biased. According to the technical solution of the present invention, the monitor cell 150 comprises a third heavily doped region having the second conductivity type, which is the third heavily doped region N+ 113, and a fourth heavily doped region having the second conductivity type, which is the fourth heavily doped region N+ 114. The at least one isolation trench 50 is configured between the third heavily doped region N+ 113 and the fourth heavily doped region N+ 114 for electrical isolation, and the third heavily doped region N+ 113 and the fourth heavily doped region N+ 114 are metal wired. In such an embodiment, the third heavily doped region N+ 113 and the fourth heavily doped region N+ 114 are formed in the N-type epitaxial layer (N-epi) 42, and the contact metal line 131 is connecting between the third heavily doped region N+ 113 and the fourth heavily doped region N+ 114 of the monitor cell 150, such that the third heavily doped region N+ 113 and the fourth heavily doped region N+ 114 form a short circuit. In other embodiment of the present invention, the third heavily doped region N+ 113 and the fourth heavily doped region N+ 114 of the monitor cell 150 may be configured in another alternative electrical connection manner in addition to forming a short circuit. The detailed descriptions of such variations will also be provided by the Applicants later in the following paragraphs of the invention.

Hereinafter, according to the technical contents of the present invention, the monitor cell 150 comprising the third heavily doped region N+ 113 and the fourth heavily doped region N+ 114, is employed to detect whether a leakage current is generated when an operation voltage is input through the first I/O terminal I/O1 or the second I/O terminal I/O2, to ensure if the first heavily doped region N+ 111 or the second heavily doped region N+ 112 is truly fabricated in the well region (P-type well 44).

Figure 5:
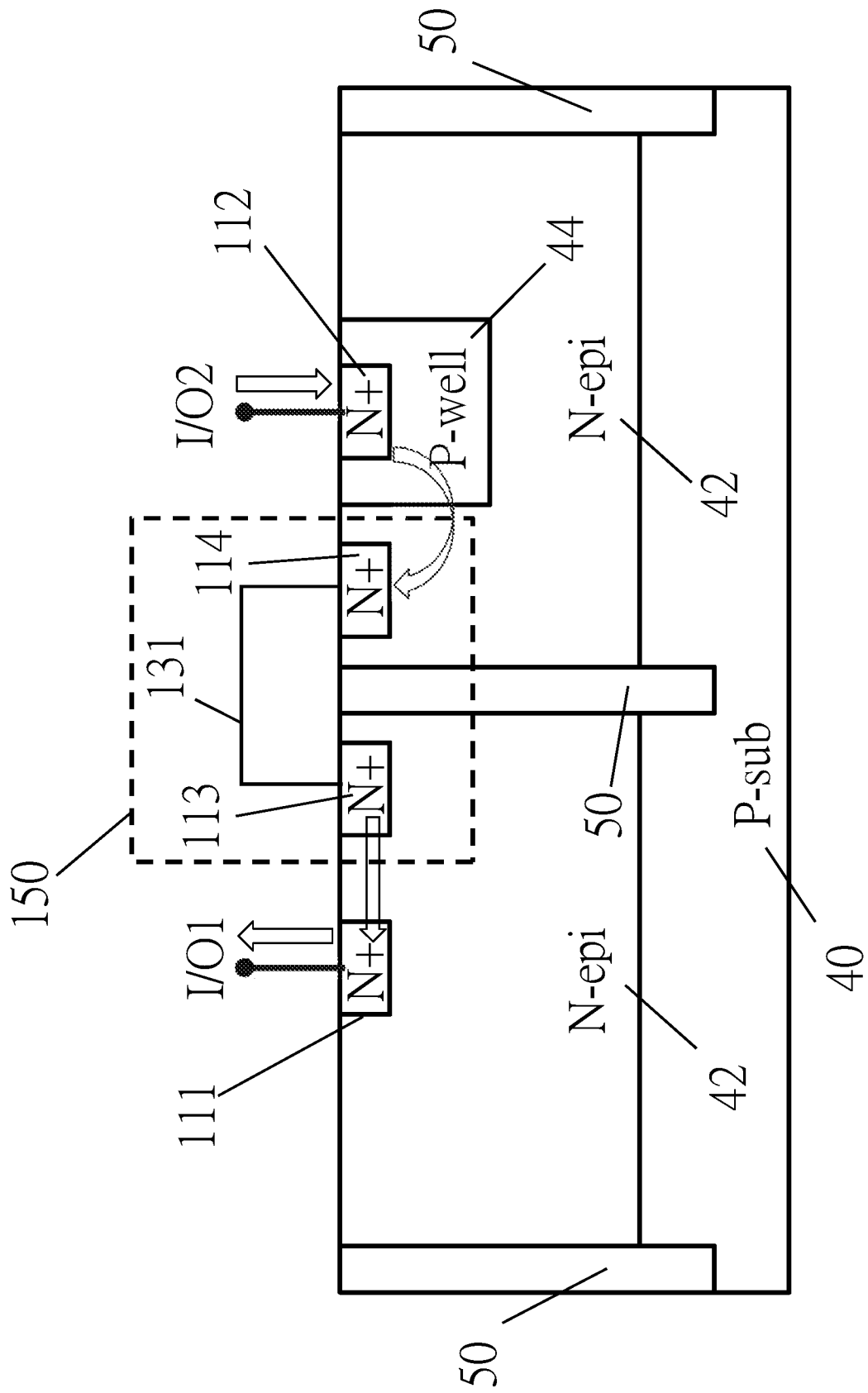
FIG. 5 schematically shows a structural diagram of the diode test module in accordance with the embodiment in FIG. 4 when the P-type well on the side of the first I/O terminal is not formed.

For example, as illustrated in the embodiments shown in FIG. 4 and FIG. 5, when the operation voltage is input through the second I/O terminal I/O2, a tremendously increasing leakage current as indicated by the arrows shown in FIG. 5, will be detected by employing the monitor cell 150 if the P-type well (P-well) 44 on the side of the first I/O terminal I/O1 is not formed. And by monitoring the leakage current, the present invention is effective in determining if the first heavily doped region N+ 111 is truly fabricated in the P-type well (P-well) 44 and finding out the failed structure by simply measuring DC leakage currents, without involving in additional capacitance measurements.

Figure 6:
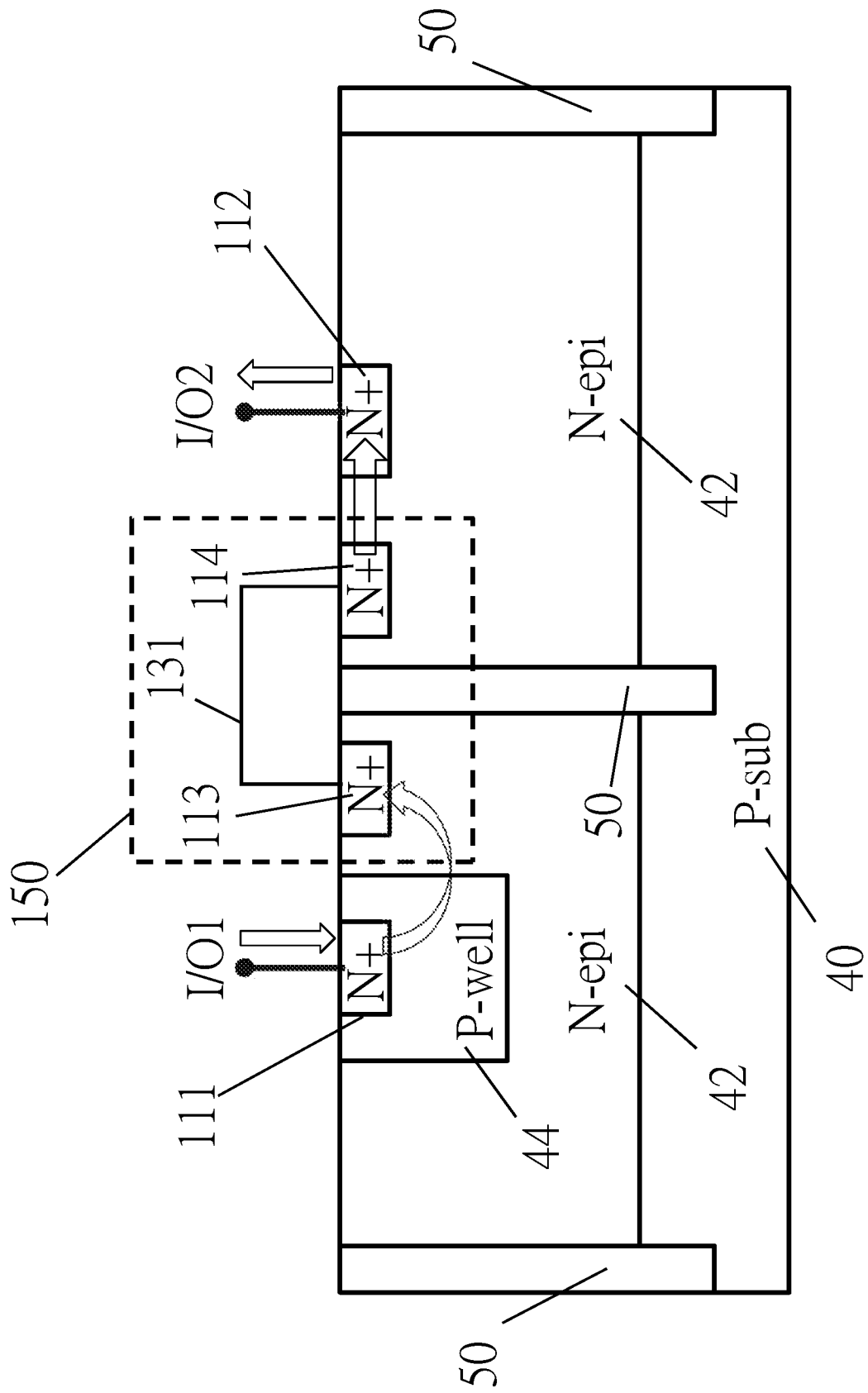
FIG. 6 schematically shows a structural diagram of the diode test module in accordance with the embodiment in FIG. 4 when the P-type well on the side of the second I/O terminal is not formed.

On the other hand, in an alternative embodiment of the present invention, as shown in FIG. 6 which schematically shows another structural diagram of the diode test module in accordance with the embodiment in FIG. 4 when the P-type well on the side of the second I/O terminal I/O2 is not formed. As can be seen from the embodiment in FIG. 6, when the operation voltage is input through the first I/O terminal I/O1, then a tremendously increasing leakage current, as indicated by the illustrative arrows shown in FIG. 6, will similarly be detected by employing the monitor cell 150 if the P-type well (P-well) 44 on the side of the second I/O terminal I/O2 is not formed. And by monitoring the leakage current, the present invention is effective in determining if the second heavily doped region N+ 112 is truly fabricated in the P-type well (P-well) 44 and finding out the failed structure by simply measuring DC leakage currents, without involving in additional capacitance measurements. As a result, the present invention successfully provides an effective method so as to determine if the first heavily doped region N+ 111 or the second heavily doped region N+ 112 is truly fabricated in the P-type well (P-well) 44 by measuring whether a leakage current is generated through the monitor cell 150.

Figure 7:
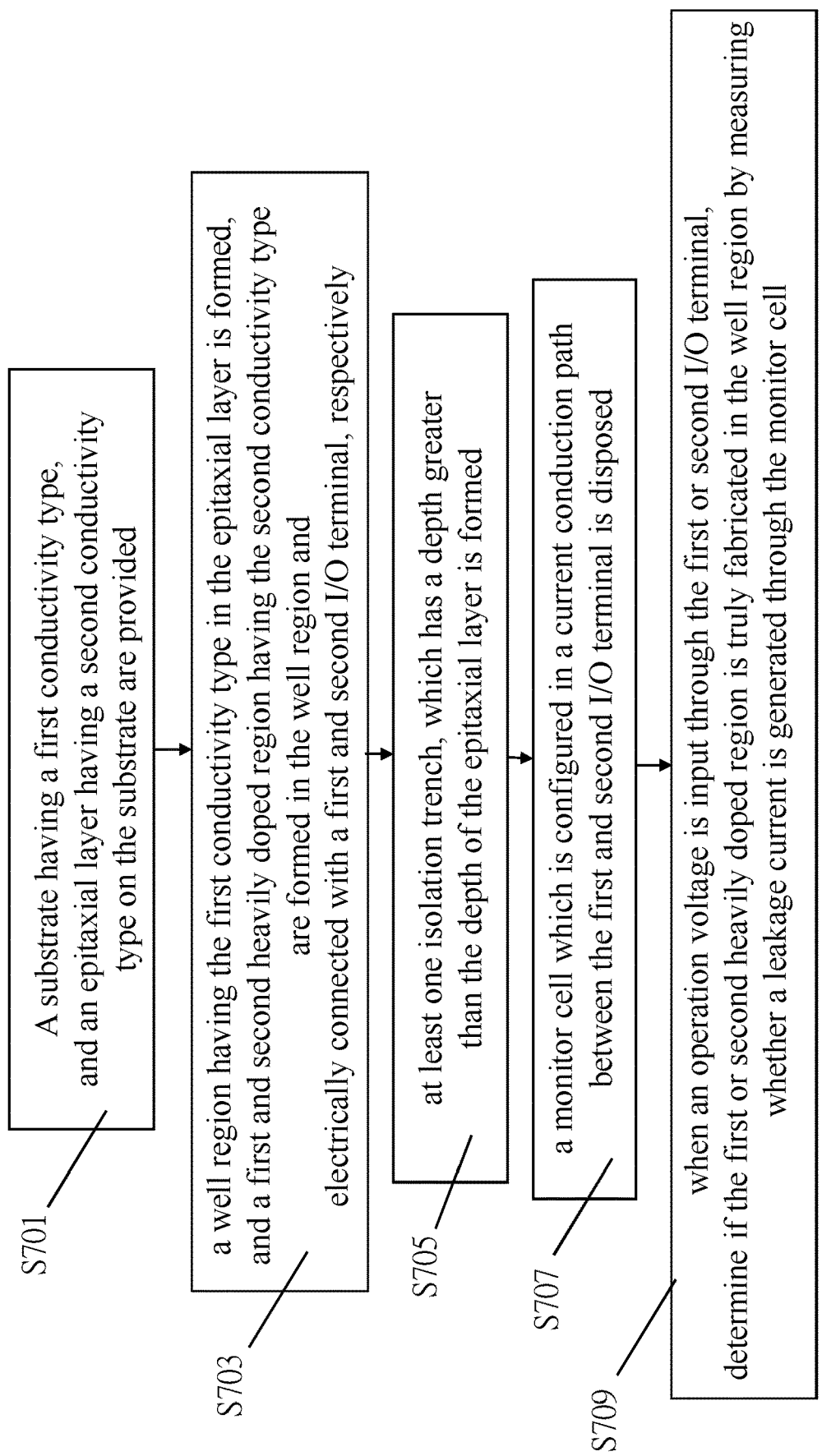
FIG. 7 shows a flow chart of the method applicable to the diode test module for monitoring leakage current in accordance with the embodiment of the present invention.

As such, in the following descriptions, please refer to FIG. 7, in which FIG. 7 shows a flow chart of the method applicable to the diode test module for monitoring leakage current in accordance with the embodiment of the present invention. As shown in FIG. 7, the method includes a plurality of following steps of S701, S703, S705, S707 and S709. For providing a better understanding of the technical contents of the proposed method, please find and refer to the previously described structure as illustrated in FIGS. 4-5 at the same time for reference numbers used in the accompanying drawings.

In the step of S701: a substrate having a first conductivity type, and an epitaxial layer having a second conductivity type on the substrate are provided. According to the embodiment in FIG. 4 and FIG. 5, the P-type substrate (P-sub) 40 and the N-type epitaxial layer (N-epi) 42 are provided.

Then in the step of S703: a well region having the first conductivity type in the epitaxial layer is formed. A first heavily doped region having the second conductivity type and a second heavily doped region having the second conductivity type are formed in the well region, and the first heavily doped region and the second heavily doped region are electrically connected with a first I/O terminal and a second I/O terminal, respectively. According to the embodiment in FIG. 4 and FIG. 5, the P-type well (P-well) 44, the first heavily doped region N+ 111 electrically connected with the first I/O terminal I/O1, and the second heavily doped region N+ 112 electrically connected with the second I/O terminal I/O2 are provided. In an ideal situation, the first heavily doped region N+ 111 and the second heavily doped region N+ 112 should be theoretically formed and disposed in the P-type well (P-well) 44.

In the step of S705: then at least one isolation trench is formed between the first heavily doped region and the second heavily doped region for electrical isolation, and the at least one isolation trench is designed to have a depth greater than the depth of the epitaxial layer. According to the embodiment in FIG. 4 and FIG. 5, at least one isolation trench 50 is formed to isolate one steering diode from another (the first heavily doped region N+ 111 and the first I/O terminal I/O1 from the second heavily doped region N+ 112 and the second I/O terminal I/O2), and the depth of the isolation trench 50 is greater than that of the N-type epitaxial layer (N-epi) 42.

Subsequently, for the purpose of the present invention that, examining if the first heavily doped region or the second heavily doped region is truly fabricated in the well region, indicating to find out if the well region is missing, the present invention proceeds to perform the step of S707: a monitor cell which is configured in a current conduction path between the first I/O terminal and the second I/O terminal when either the first I/O terminal or the second I/O terminal is biased is disposed.

As referring to the embodiment in FIG. 4 and FIG. 5, it is the monitor cell 150 comprising a third heavily doped region having the second conductivity type, which is the third heavily doped region N+ 113, and a fourth heavily doped region having the second conductivity type, which is the fourth heavily doped region N+ 114 to be disposed. Therein between the third heavily doped region N+ 113 and the fourth heavily doped region N+ 114 is the at least one isolation trench 50 for electrical isolation, and the third heavily doped region N+ 113 and the fourth heavily doped region N+ 114 are metal wired. Hereinafter, the third heavily doped region N+ 113 and the fourth heavily doped region N+ 114 are formed in the N-type epitaxial layer (N-epi) 42 and connecting though a contact metal line 131 such that the third heavily doped region N+ 113 and the fourth heavily doped region N+ 114 form a short circuit.

As a result, in the step of S709: when an operation voltage is input through the first I/O terminal or the second I/O terminal, it can be determined if the first heavily doped region or the second heavily doped region is truly fabricated in the well region by measuring whether a leakage current is generated through the monitor cell.

As referring to the embodiment in FIG. 4 and FIG. 5, then the operation voltage will be input through the second I/O terminal I/O2, and by employing the monitor cell 150 including the third heavily doped region N+ 113 and the fourth heavily doped region N+ 114 and monitoring the leakage current in view of a current path from the second I/O terminal I/O2 to the first I/O terminal I/O1, if a greatly increasing leakage current will be detected, then the proposed method of the present invention determines that the first heavily doped region N+ 111 is NOT truly fabricated in the P-type well (P-well) 44 (indicating that the P-well 44 on the side of the first I/O terminal I/O1 is missing). As a result, the failed structure is successfully and effectively detected without involving in any additional capacitance measurements, and only simple DC current measurements are required.

According to the proposed technical contents of the present invention, such test method can be also applied to the embodiment as illustrated in FIG. 6, when the P-type well on the side of the second I/O terminal I/O2 is not formed. Since the detailed descriptions are similar, the Applicants spare the similar descriptions.

Figure 8:
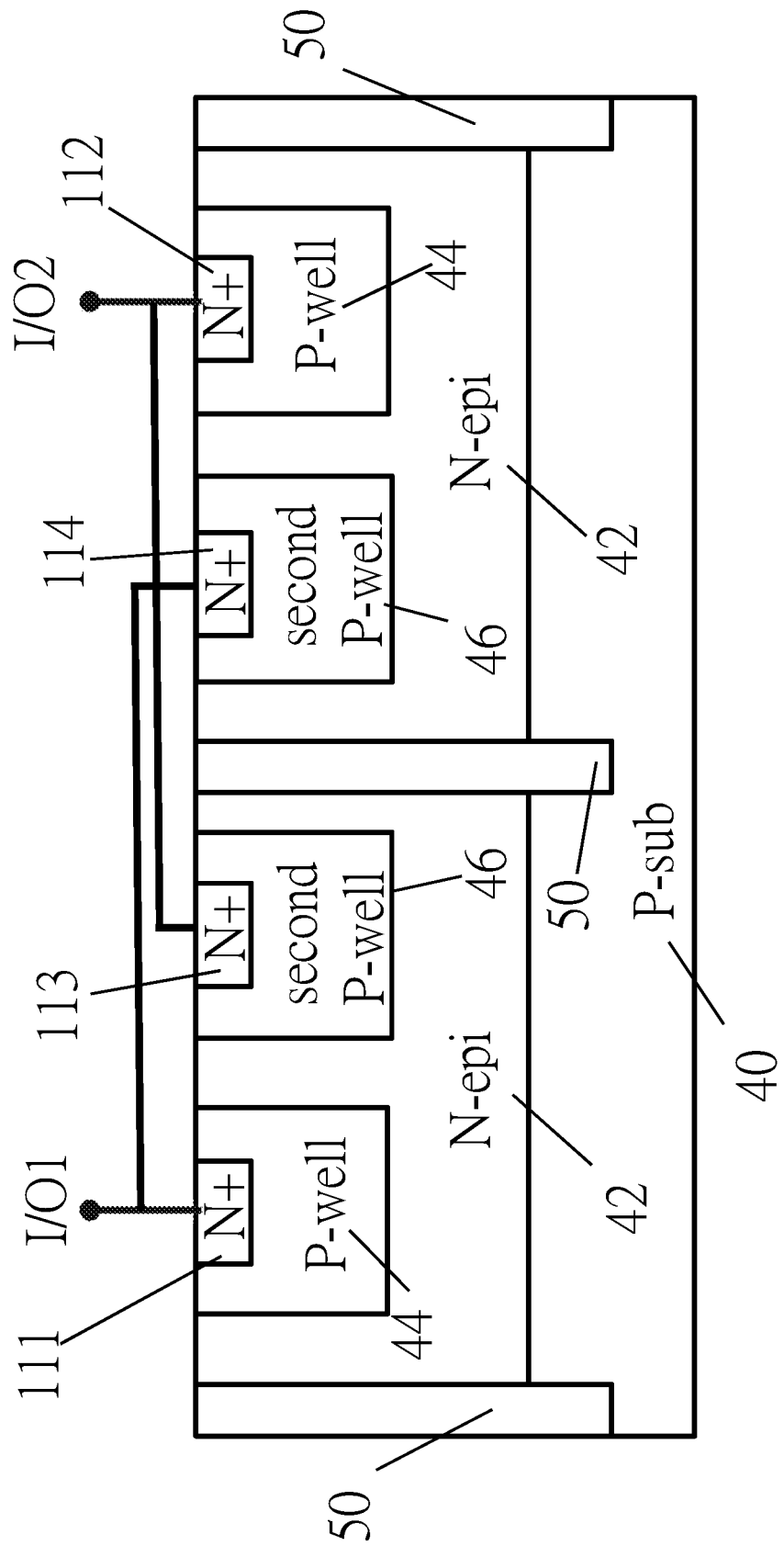
FIG. 8 schematically shows a structural diagram of a diode test module in accordance with a second embodiment of the present invention, wherein a second well region is formed for disposing the third heavily doped region and the fourth heavily doped region of the monitor cell.

In addition, according to the technical characteristics of the present invention, it is worth emphasizing that, in the step of S707 wherein it recites that the third heavily doped region and the fourth heavily doped region are metal wired, such metal wired connection is not limited to the foregoing embodiment as mentioned in FIG. 4 and FIG. 5 in which the third heavily doped region and the fourth heavily doped region form a short circuit. An alternative metal wired connection manner is provided by the Applicants as shown in FIG. 8. Please refer to FIG. 8 for a structural diagram of a diode test module in accordance with a second embodiment of the present invention. In the embodiment of FIG. 8, a second well region having the first conductivity type is formed in the epitaxial layer, and the third heavily doped region and the fourth heavily doped region are formed in the second well region, instead. As we can see from FIG. 8, what differs from the previously described embodiment in FIG. 4 and FIG. 5 is that, a second P-type well (second P-well) 46 is further provided in the N-type epitaxial layer (N-epi) 42, such that the third heavily doped region N+ 113 and the fourth heavily doped region N+ 114 are formed in the second P-well 46 instead of being directly formed in the N-epi 42. In such a variation embodiment, the third heavily doped region N+ 113 and the fourth heavily doped region N+ 114 are NOT forming a short circuit, but respectively connected to the second I/O terminal I/O2 and the first I/O terminal I/O1. To be more specific, the third heavily doped region N+ 113 is configured adjacent to the first heavily doped region N+ 111 and electrically connected with the second I/O terminal I/O2, and the fourth heavily doped region N+ 114 is configured adjacent to the second heavily doped region N+ 112 and electrically connected with the first I/O terminal I/O1.

Figure 9:
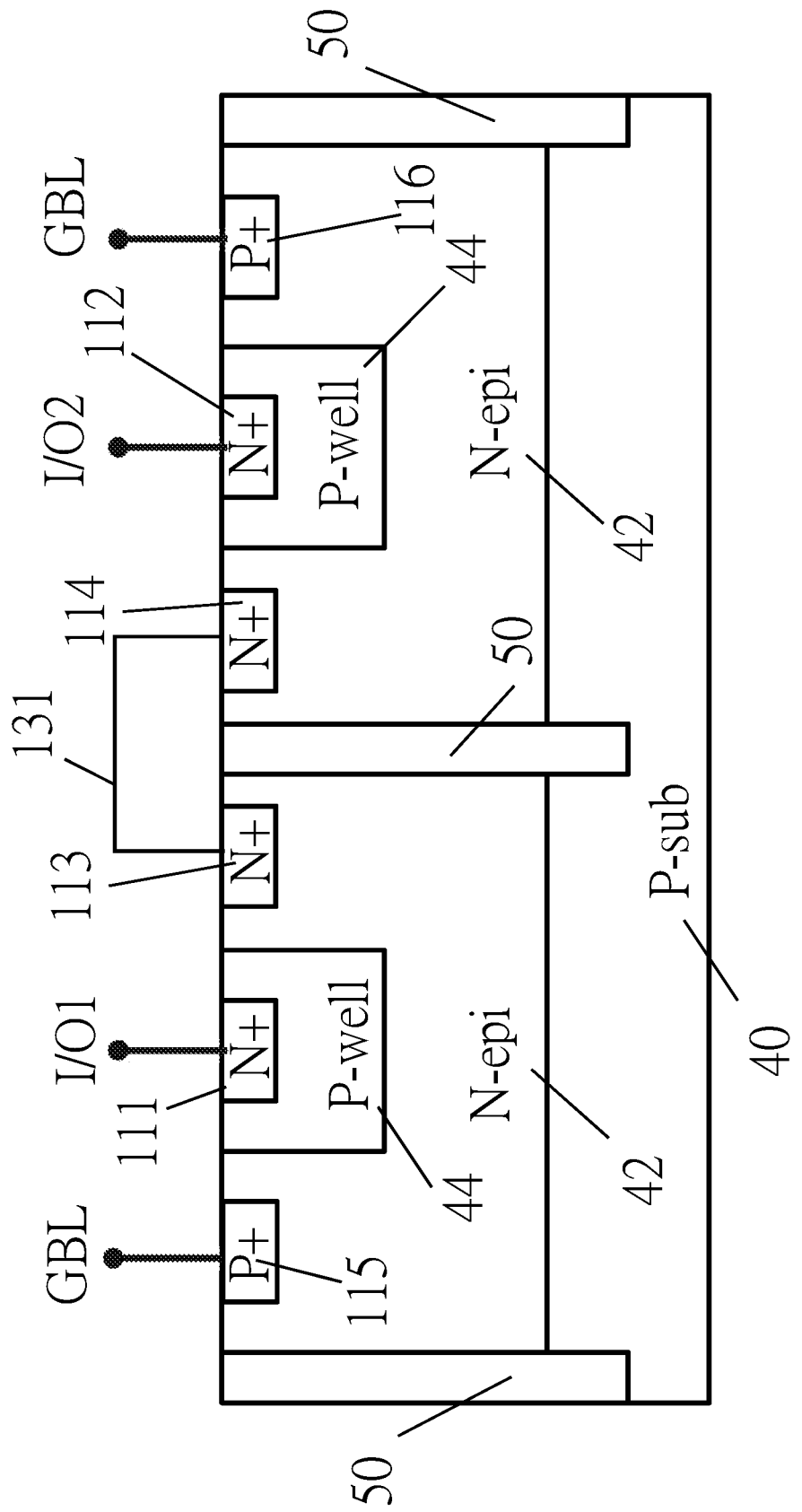
FIG. 9 schematically shows another structural variation diagram of a diode test module in accordance with the present invention based on the embodiment in FIG. 4, further comprising a fifth heavily doped region and a sixth heavily doped region which are formed in the epitaxial layer, wherein the first conductivity type is P-type, and the second conductivity type is N-type.

FIG. 9 shows another structural variation diagram of a diode test module in accordance with the present invention based on the embodiment in FIG. 4. As seen in the embodiment in FIG. 9, the diode test module may further comprise a fifth heavily doped region having the first conductivity type, which is the P-type heavily doped region (P+) 115 and a sixth heavily doped region having the first conductivity type, which is the P-type heavily doped region (P+) 116.

The fifth heavily doped region P+ 115 is formed in the N-epi 42 and adjacent to the first heavily doped region N+ 111, and the sixth heavily doped region P+ 116 is formed in the N-epi 42 and adjacent to the second heavily doped region N+ 112. As when the first conductivity type is P-type, and the second conductivity type is N-type, it is believed that the fifth heavily doped region P+ 115 and the sixth heavily doped region P+ 116 are electrically connected to a ground bus line GBL.

Figure 10:
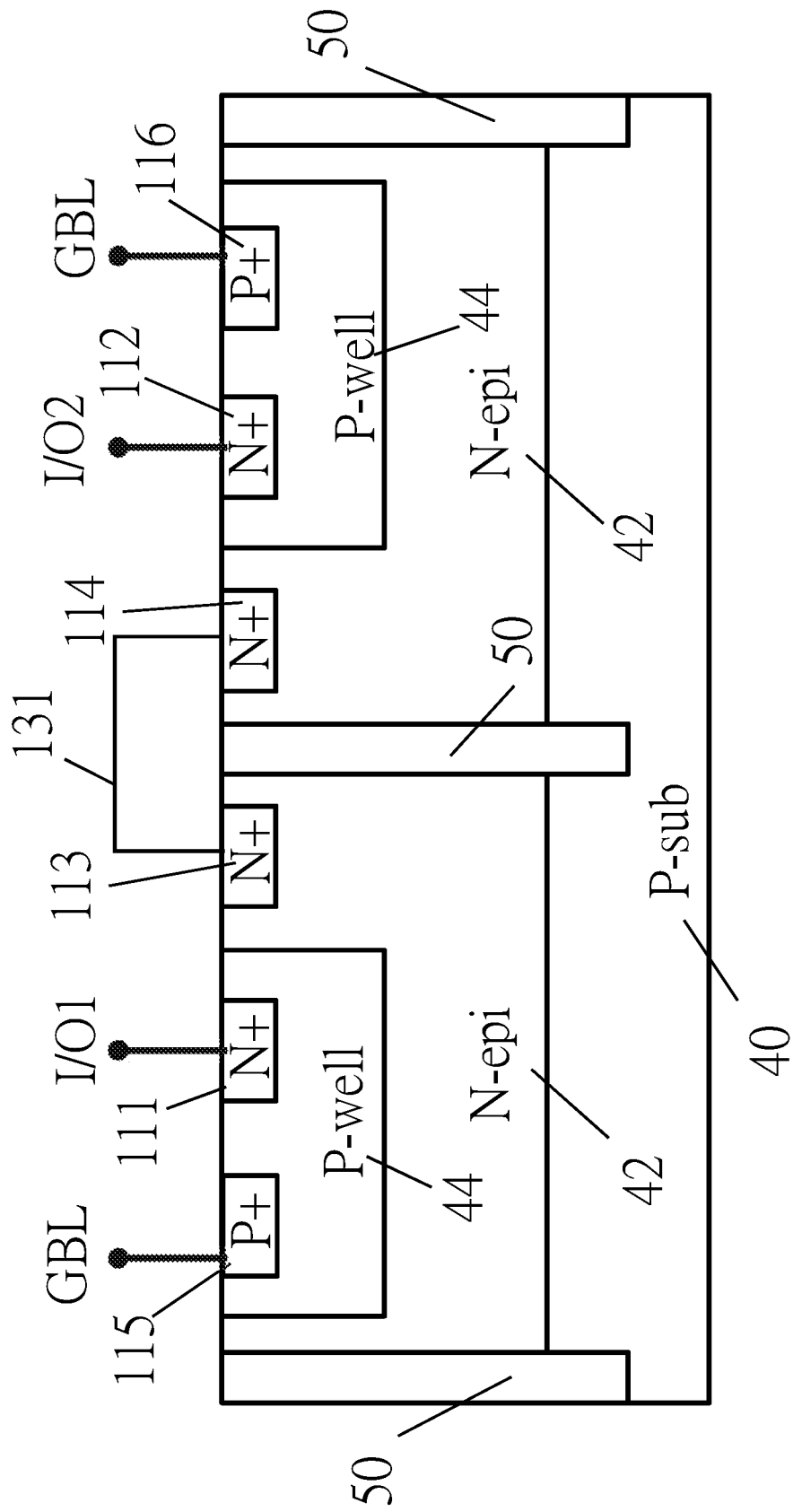
FIG. 10 schematically shows another structural variation diagram of a diode test module in accordance with the present invention based on the embodiment in FIG. 9, wherein the fifth heavily doped region and the sixth heavily doped region are formed in the well region.

Furthermore, FIG. 10 shows another structural variation diagram of a diode test module in accordance with the present invention based on the embodiment in FIG. 9. The difference between the embodiment in FIG. 10 and the embodiment in FIG. 9 is that, in FIG. 10 the fifth heavily doped region P+ 115 and the sixth heavily doped region P+ 116 can be also configured to be formed in the P-type well (P-well) 44.

Figure 11:
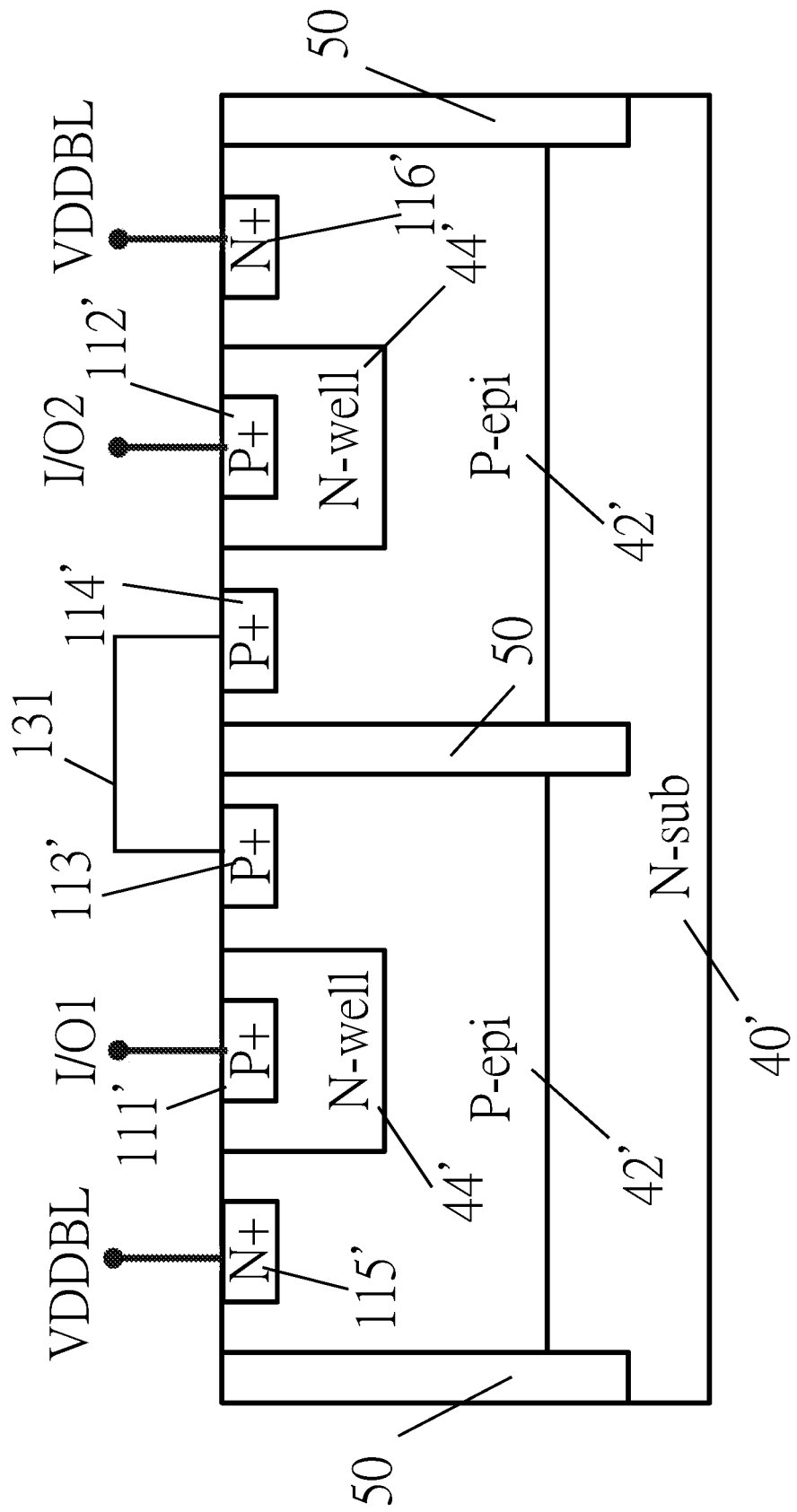
FIG. 11 schematically shows another structural variation diagram of a diode test module in accordance with the present invention based on the embodiment in FIG. 9, wherein the first conductivity type is N-type, and the second conductivity type is P-type.

In another aspect, please refer to FIG. 11, which shows a structural variation diagram of a diode test module in accordance with the present invention based on the embodiment in FIG. 9. As we have discussed earlier in FIG. 9, it was determined that the first conductivity type is P-type, and the second conductivity type is N-type. However, for people who have ordinary knowledge and are skilled in the art, it is obvious that the conductivity type can be adjusted and modified according to practical requirements. As a result, the Applicants further provide FIG. 11, which is a variation of FIG. 9. In the embodiment of FIG. 11, it is determined that the first conductivity type is N-type, and the second conductivity type is P-type. And, in such a condition, the substrate having the first conductivity type is provided as an N-type substrate (N-sub) 40'. The epitaxial layer having the second conductivity type on the substrate is provided as a P-type epitaxial layer (P-epi) 42'. The well region having the first conductivity type in the epitaxial layer is provided as an N-type well (N-well) 44'. And, the first heavily doped region, the second heavily doped region, the third heavily doped region and the fourth heavily doped region having the second conductivity type are provided as P+ 111', P+ 112', P+ 113' and P+ 114'.

The fifth heavily doped region and the sixth heavily doped region having the first conductivity type are provided as N+ 115' and N+ 116', and the fifth heavily doped region N+ 115' and the sixth heavily doped region N+ 116' are electrically connected to a high voltage level bus line VDDBL, instead.

Figure 12:
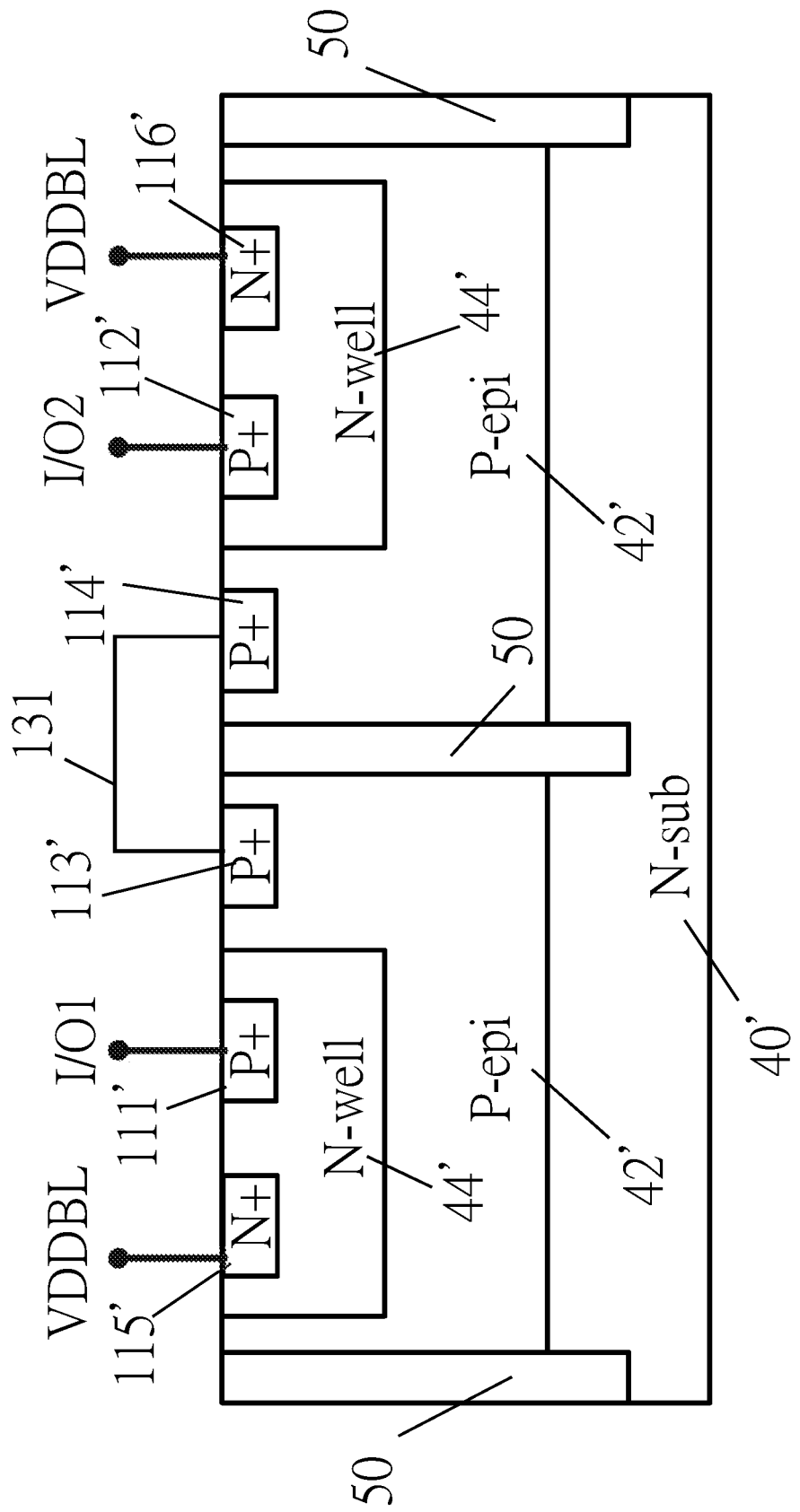
FIG. 12 schematically shows another structural variation diagram of a diode test module in accordance with the present invention based on the embodiment in FIG. 11, wherein the fifth heavily doped region and the sixth heavily doped region are formed in the well region.

Moreover, FIG. 12 shows another structural variation diagram of a diode test module in accordance with the present invention based on the embodiment in FIG. 11. In the embodiment of FIG. 11, the fifth heavily doped region N+ 115' and the sixth heavily doped region N+ 116' are formed in the P-type epitaxial layer (P-epi) 42'. On the other hand, in the embodiment of FIG. 12, the fifth heavily doped region N+ 115' and the sixth heavily doped region N+ 116' can also be configured so as to be formed in the N-type well (N-well) 44'.

Figure 13:
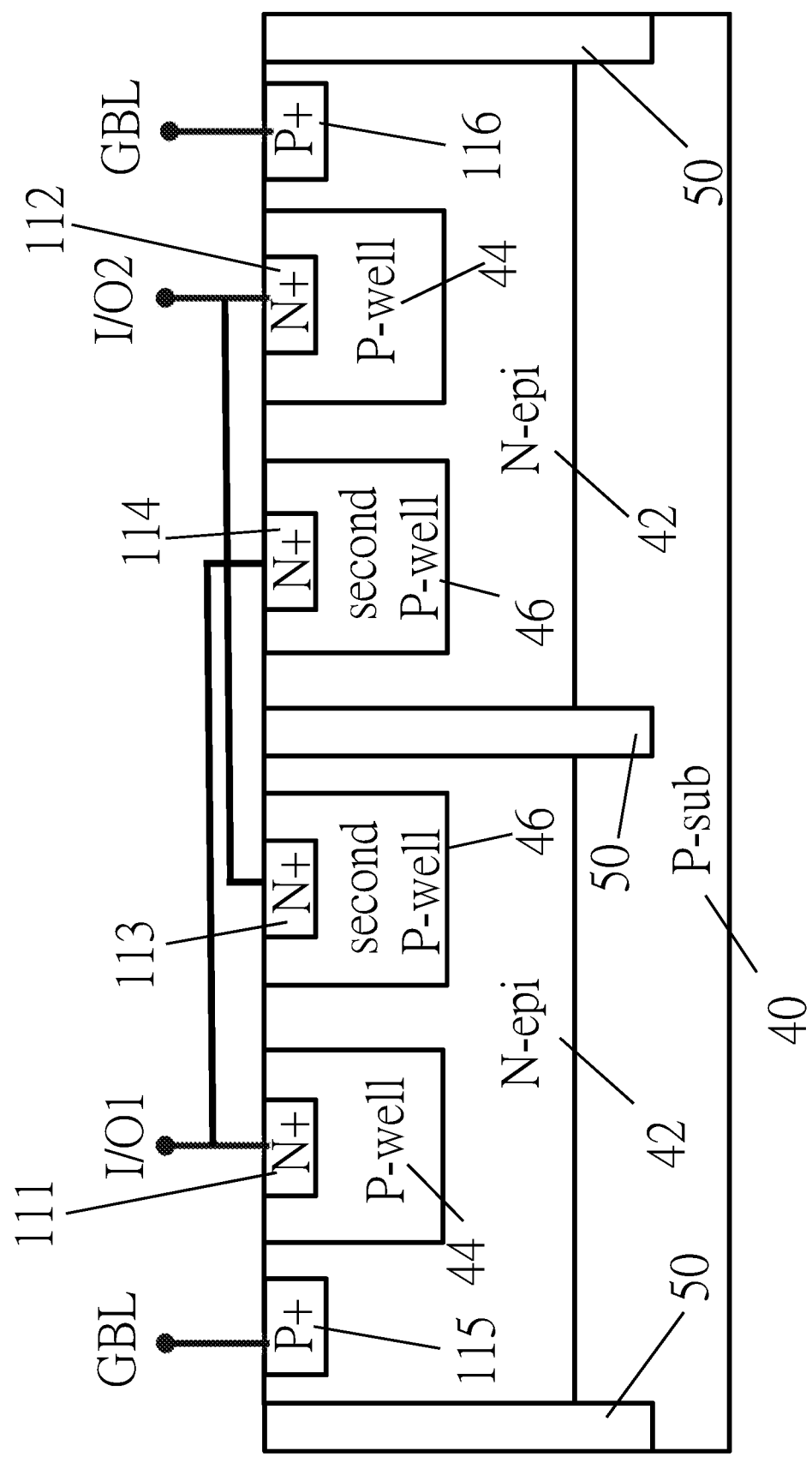
FIG. 13 schematically shows another structural variation diagram of a diode test module in accordance with the present invention based on the embodiment in FIG. 8, further comprising a fifth heavily doped region and a sixth heavily doped region which are formed in the epitaxial layer, wherein the first conductivity type is P-type, and the second conductivity type is N-type.

In view of the similar design rules, the configurations of the above-mentioned fifth heavily doped region and the sixth heavily doped region may also be further disposed based on the embodiment of FIG. 8. Such variation is illustrated as shown in FIG. 13. As can be seen in FIG. 13, the third heavily doped region N+ 113 and the fourth heavily doped region N+ 114 are formed in the second P-type well (second P-well) 46, and electrically connected with the second I/O terminal I/O2 and the first I/O terminal I/O1, respectively. The fifth heavily doped region P+ 115 is formed in the N-type epitaxial layer (N-epi) 42 and adjacent to the first heavily doped region N+ 111, and the sixth heavily doped region P+ 116 is formed in the N-type epitaxial layer (N-epi) 42 and adjacent to the second heavily doped region N+ 112. The fifth heavily doped region P+ 115 and the sixth heavily doped region P+ 116 are electrically connected to a ground bus line GBL.

Figure 14:
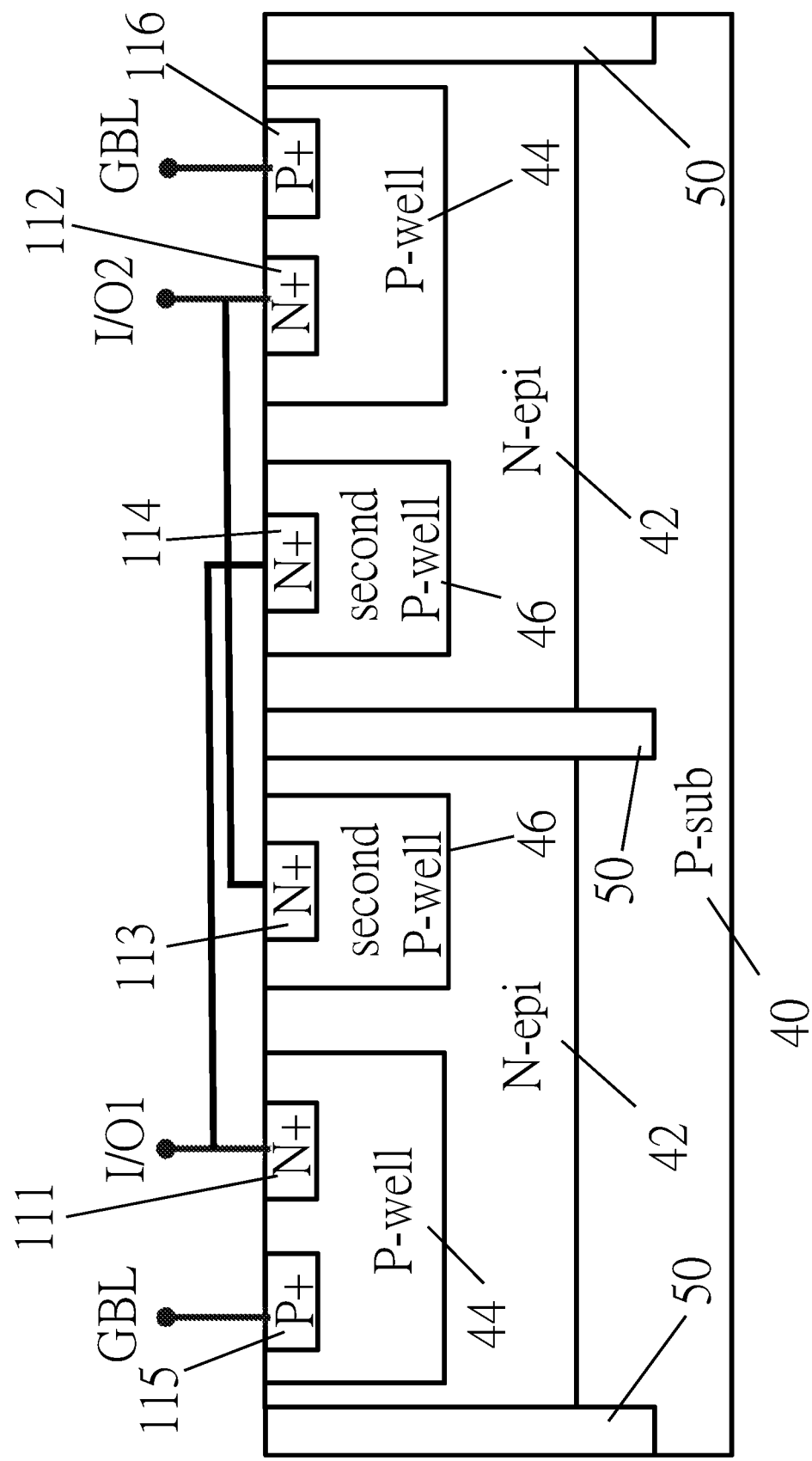
FIG. 14 schematically shows another structural variation diagram of a diode test module in accordance with the present invention based on the embodiment in FIG. 13, wherein the fifth heavily doped region and the sixth heavily doped region are formed in the well region.

However, as noted earlier in the previous embodiments, instead of forming the fifth heavily doped region P+ 115 and the sixth heavily doped region P+ 116 in the N-type epitaxial layer (N-epi) 42, it is also practicable to dispose the fifth heavily doped region P+ 115 and the sixth heavily doped region P+ 116 in the P-type well (P-well) 44. Such variation is shown as illustrated in FIG. 14 of the present invention.

Figure 15:
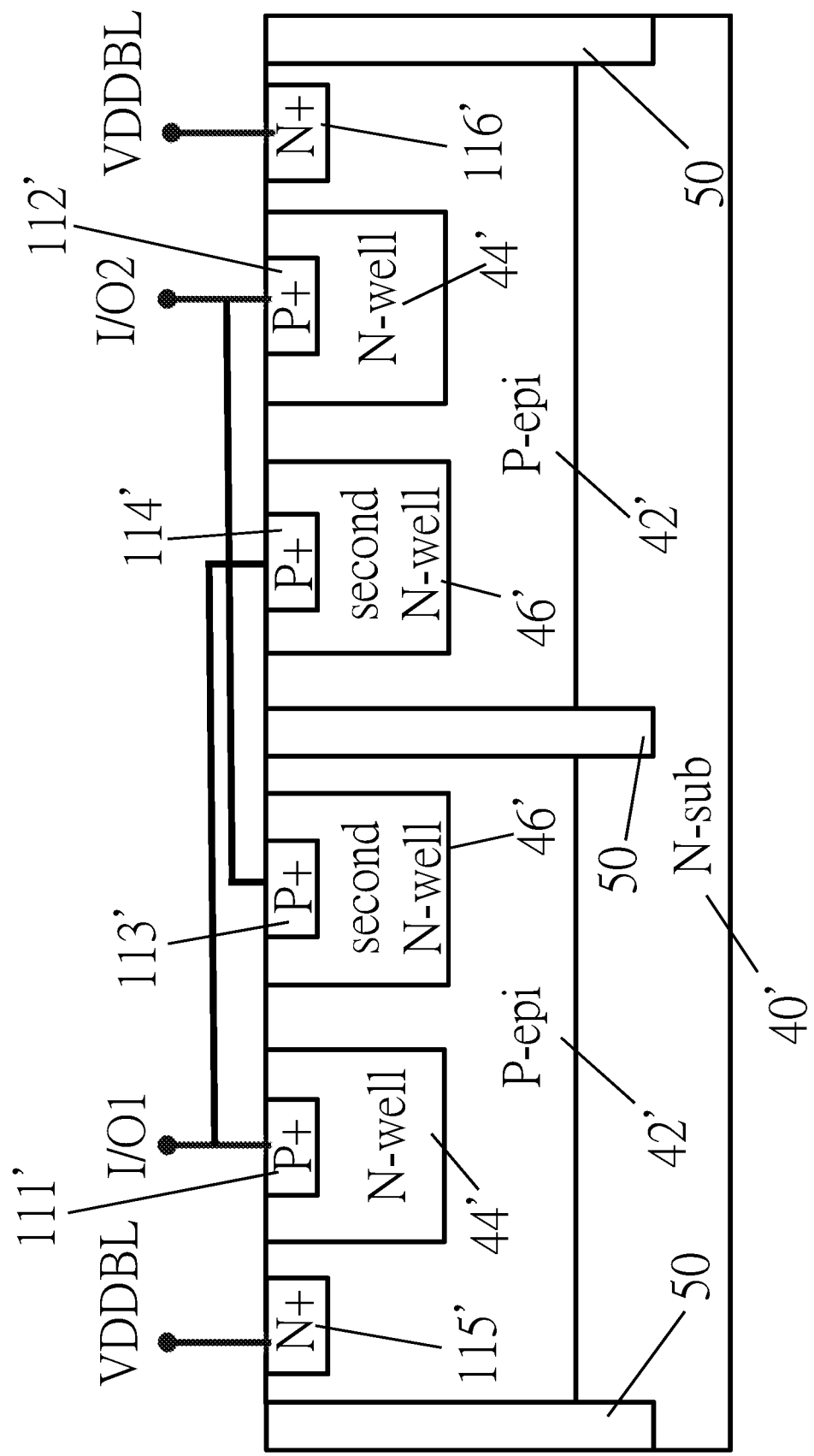
FIG. 15 schematically shows another structural variation diagram of a diode test module in accordance with the present invention based on the embodiment in FIG. 13, wherein the first conductivity type is N-type, and the second conductivity type is P-type.

Moreover, FIG. 15 shows a variation embodiment of FIG. 13. In the embodiment of FIG. 13, the first conductivity type is P-type, and the second conductivity type is N-type. While in the embodiment of FIG. 15, the first conductivity type is N-type, and the second conductivity type is P-type. As a result, in such an embodiment, the substrate having the first conductivity type is provided as the N-type substrate (N-sub) 40'. The epitaxial layer having the second conductivity type on the substrate is provided as a P-type epitaxial layer (P-epi) 42'. The well region having the first conductivity type in the epitaxial layer is provided as an N-type well (N-well) 44'. And, the first heavily doped region, the second heavily doped region, the third heavily doped region and the fourth heavily doped region having the second conductivity type are provided as P+ 111', P+ 112', P+ 113' and P+ 114'. And, the third heavily doped region P+ 113' and the fourth heavily doped region P+ 114' of the monitor cell are disposed in a second N-type well (second N-well) 46'. The fifth heavily doped region and the sixth heavily doped region having the first conductivity type are provided as N+ 115' and N+ 116'. And the fifth heavily doped region N+115' and the sixth heavily doped region N+ 116' are electrically connected to a high voltage level bus line VDDBL, instead.

Figure 16:
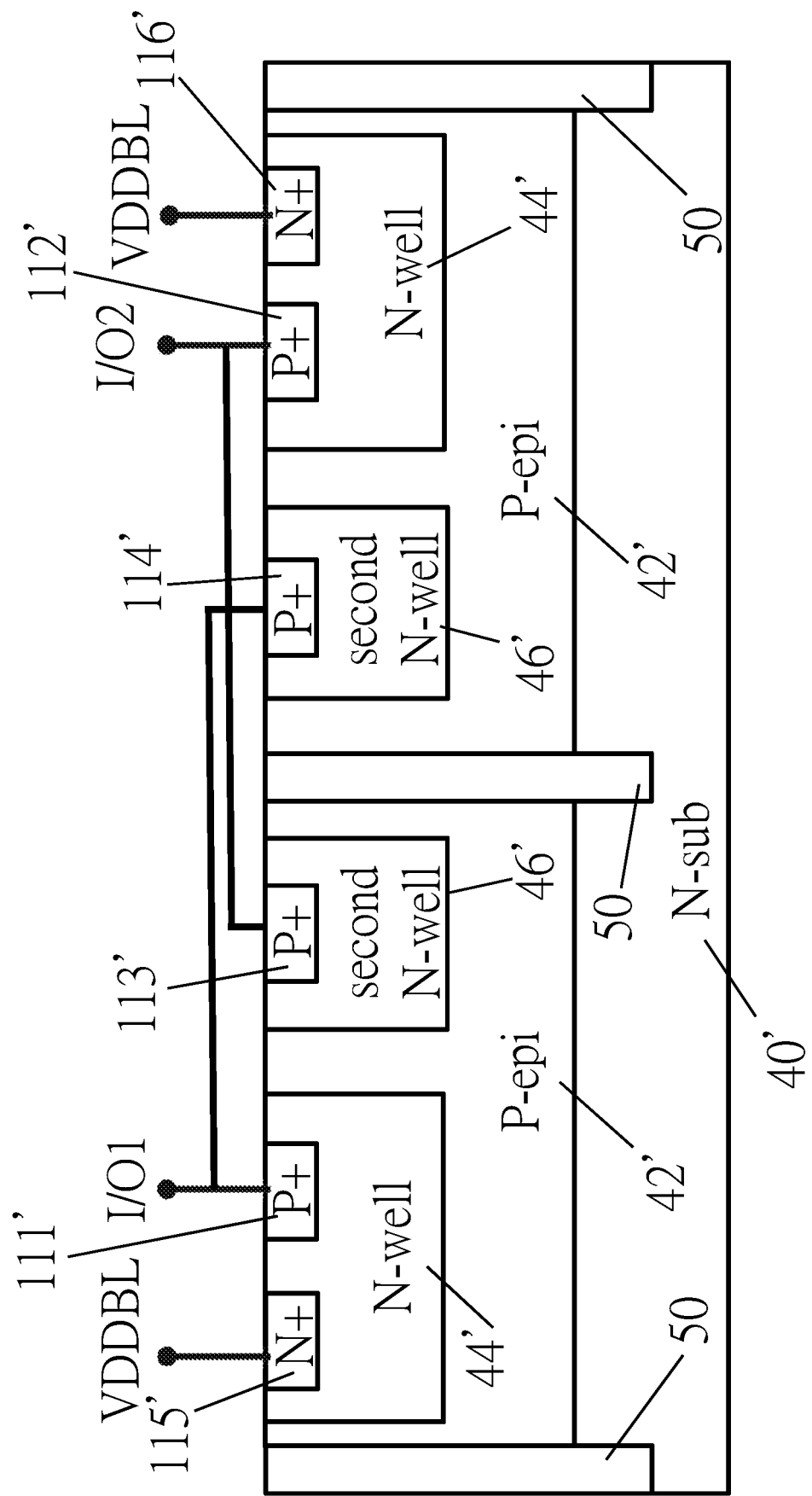
FIG. 16 schematically shows another structural variation diagram of a diode test module in accordance with the present invention based on the embodiment in FIG. 15, wherein the fifth heavily doped region and the sixth heavily doped region are formed in the well region.

And furthermore, please refer to FIG. 16, in which FIG. 16 shows yet another structural variation diagram of a diode test module in accordance with the present invention based on the embodiment in FIG. 15. In the embodiment of FIG. 15, the fifth heavily doped region N+ 115' and the sixth heavily doped region N+ 116' are formed in the P-type epitaxial layer (P-epi) 42'. On the other hand, in the embodiment of FIG. 16, the fifth heavily doped region N+ 115' and the sixth heavily doped region N+ 116' can also be configured, so as to be formed in the N-type well (N-well) 44'.

As a result, to sum up the above-mentioned embodiments provided by the Applicants, it is believed that the proposed monitor cell of the present invention is aimed to monitor and detect whether a leakage current is generated when an operation voltage is input through the first I/O terminal or the second I/O terminal, in order to determine if the well region is actually fabricated in the steering diodes configuration.

According to the technical contents provided by the Applicants as illustrated in the previous paragraphs, it is obvious that the diode test module and its test method thereof are effective. Furthermore, the proposed monitor cell structure of the present invention consumes extremely tiny area and can be used to examine whether or not the steering diodes configuration is successfully fabricated without any needs to make the area incensements. Even if the well region had been successfully fabricated and resulting in no leakage current being measured, the monitor cell structure itself, does not affect any of the DC electrical characteristics of the semiconductor device (for instance, a transient voltage suppressor, TVS). Therefore, in view of all, it is obvious that the present invention is not only novel and inventive but also believed to be advantageous of reducing and avoiding additional test production cost and time for conventional capacitance measurements.

As a result, when compared to the prior arts, it is ensured that the present invention apparently shows much more effective performances than before. In addition, it is believed that the present invention is instinct, effective and highly competitive for IC technology and industries in the market nowadays, whereby having extraordinary availability and competitiveness for future industrial developments and being in condition for early allowance.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. A method applicable to a diode test module for monitoring leakage current, comprising:
   providing a substrate having a first conductivity type, and an epitaxial layer having a second conductivity type on the substrate;
   forming a well region having the first conductivity type in the epitaxial layer, and a first heavily doped region having the second conductivity type and a second heavily doped region having the second conductivity type in the well region, wherein the first heavily doped region and the second heavily doped region are electrically connected with a first I/O terminal and a second I/O terminal, respectively;
   forming at least one isolation trench between the first heavily doped region and the second heavily doped region for electrical isolation, wherein the at least one isolation trench has a depth greater than that of the epitaxial layer;
   providing a monitor cell which is configured in a current conduction path between the first I/O terminal and the second I/O terminal when either the first I/O terminal or the second I/O terminal is biased, wherein the monitor cell comprises a third heavily doped region having the second conductivity type and a fourth heavily doped region having the second conductivity type, the at least one isolation trench is configured between the third heavily doped region and the fourth heavily doped region for electrical isolation, and the third heavily doped region and the fourth heavily doped region are metal wired; and when an operation voltage is input through the first I/O terminal or the second I/O terminal, it is determined if the first heavily doped region or the second heavily doped region is truly fabricated in the well region by measuring whether a leakage current is generated through the monitor cell.

2. The method applicable to a diode test module for monitoring leakage current according to claim 1, wherein the third heavily doped region and the fourth heavily doped region are formed in the epitaxial layer, and a contact metal line is connecting between the third heavily doped region and the fourth heavily doped region of the monitor cell, such that the third heavily doped region and the fourth heavily doped region form a short circuit.

3. The method applicable to a diode test module for monitoring leakage current according to claim 2, further comprising a fifth heavily doped region having the first conductivity type and a sixth heavily doped region having the first conductivity type, wherein the fifth heavily doped region is formed in the epitaxial layer and adjacent to the first heavily doped region, and the sixth heavily doped region is formed in the epitaxial layer and adjacent to the second heavily doped region.

4. The method applicable to a diode test module for monitoring leakage current according to claim 3, wherein when the first conductivity type is P-type, the second conductivity type is N-type, and the fifth heavily doped region and the sixth heavily doped region are electrically connected to a ground bus line.

5. The method applicable to a diode test module for monitoring leakage current according to claim 3, wherein when the first conductivity type is N-type, the second conductivity type is P-type, and the fifth heavily doped region and the sixth heavily doped region are electrically connected to a high voltage level bus line.

6. The method applicable to a diode test module for monitoring leakage current according to claim 2, further comprising a fifth heavily doped region having the first conductivity type and a sixth heavily doped region having the first conductivity type, wherein the fifth heavily doped region is formed in the well region and adjacent to the first heavily doped region, and the sixth heavily doped region is formed in the well region and adjacent to the second heavily doped region.

7. The method applicable to a diode test module for monitoring leakage current according to claim 6, wherein when the first conductivity type is P-type, the second conductivity type is N-type, and the fifth heavily doped region and the sixth heavily doped region are electrically connected to a ground bus line.

8. The method applicable to a diode test module for monitoring leakage current according to claim 6, wherein when the first conductivity type is N-type, the second conductivity type is P-type, and the fifth heavily doped region and the sixth heavily doped region are electrically connected to a high voltage level bus line.

9. The method applicable to a diode test module for monitoring leakage current according to claim 1, further comprising a second well region having the first conductivity type in the epitaxial layer, and the third heavily doped region and the fourth heavily doped region are formed in the second well region, wherein the third heavily doped region is configured adjacent to the first heavily doped region and electrically connected with the second I/O terminal, and the fourth heavily doped region is configured adjacent to the second heavily doped region and electrically connected with the first I/O terminal.

10. The method applicable to a diode test module for monitoring leakage current according to claim 9, further comprising a fifth heavily doped region having the first conductivity type and a sixth heavily doped region having the first conductivity type, wherein the fifth heavily doped region is formed in the epitaxial layer and adjacent to the first heavily doped region, and the sixth heavily doped region is formed in the epitaxial layer and adjacent to the second heavily doped region.

11. The method applicable to a diode test module for monitoring leakage current according to claim 10, wherein when the first conductivity type is P-type, the second conductivity type is N-type, and the fifth heavily doped region and the sixth heavily doped region are electrically connected to a ground bus line.

12. The method applicable to a diode test module for monitoring leakage current according to claim 10, wherein when the first conductivity type is N-type, the second conductivity type is P-type, and the fifth heavily doped region and the sixth heavily doped region are electrically connected to a high voltage level bus line.

13. The method applicable to a diode test module for monitoring leakage current according to claim 9, further comprising a fifth heavily doped region having the first conductivity type and a sixth heavily doped region having the first conductivity type, wherein the fifth heavily doped region is formed in the well region and adjacent to the first heavily doped region, and the sixth heavily doped region is formed in the well region and adjacent to the second heavily doped region.

14. The method applicable to a diode test module for monitoring leakage current according to claim 13, wherein when the first conductivity type is P-type, the second conductivity type is N-type, and the fifth heavily doped region and the sixth heavily doped region are electrically connected to a ground bus line.

15. The method applicable to a diode test module for monitoring leakage current according to claim 13, wherein when the first conductivity type is N-type, the second conductivity type is P-type, and the fifth heavily doped region and the sixth heavily doped region are electrically connected to a high voltage level bus line.

* * * * *